United States Patent [19]
Tomita

[11] Patent Number: 5,939,913
[45] Date of Patent: Aug. 17, 1999

[54] DLL CIRCUIT AND SEMICONDUCTOR MEMORY DEVICE USING SAME

[75] Inventor: Hiroyoshi Tomita, Kawasaki, Japan

[73] Assignee: Fujitsu Limited, Kanagawa, Japan

[21] Appl. No.: 09/019,197

[22] Filed: Feb. 5, 1998

[30] Foreign Application Priority Data

Sep. 9, 1997 [JP] Japan .................................. 9-243714

[51] Int. Cl.⁶ ........................................................ H03L 7/06
[52] U.S. Cl. ........................... 327/158; 327/159; 327/236; 331/DIG. 2; 375/376
[58] Field of Search .................................... 327/158, 159, 327/161, 233, 236, 261, 156; 331/DIG. 2; 375/376

[56] References Cited

U.S. PATENT DOCUMENTS

| | | | |
|---|---|---|---|
| 5,642,082 | 6/1997 | Jefferson | 327/159 |
| 5,712,884 | 1/1998 | Jeong | 327/158 |
| 5,815,016 | 9/1998 | Erickson | 327/158 |

Primary Examiner—Terry D. Cunningham
Assistant Examiner—Jung Ho Kim
Attorney, Agent, or Firm—Nikaido Marmelstein Murray & Oram LLP

[57] ABSTRACT

The present invention supplies a first delay control signal generated by a DLL circuit to a first variable delay circuit which generates a control clock by delaying a clock for a prescribed time period. The DLL circuit comprises: a first delay loop, comprising a second variable delay circuit and a third variable delay circuit connected in series, to which the clock is supplied; a phase comparator which is supplied with a clock which delays an integral factor of 360° of said clock from the clock, as a reference clock, and the output of the first delay loop, as a variable clock; and a delay control circuit which generates said first delay control signal in accordance with a phase comparison result signal from the phase comparator such that there is no phase difference with said two supplied clocks. The second variable delay circuit is supplied with the first delay control signal. The third variable delay circuit has a delay time of β° in accordance with a second delay control signal generated by a β° detecting circuit. As a result, the second variable delay circuit generates a delay time of approximately 360°−β°=α°. By similarly controlling the delay time of the first variable delay circuit by means of this first delay control signal, the control clock output therefrom is phase delayed by α° from the clock.

9 Claims, 10 Drawing Sheets

PRINCIPLE OF EMBODIMENT

VARIABLE DELAY CIRCUIT

DELAY CONTROL CIRCUIT

SYNCHRONOUS DRAM

TIMING CHART OF SDRAM

DLL CIRCUIT AND SEMICONDUCTOR MEMORY DEVICE USING SAME

BACKGROUND OF THE INVENTION

1. Field of the Invention

The present invention relates to a DLL (Delayed Lock Loop) circuit which generates timing signals delayed by a prescribed phase with respect to an external reference clock, and a semiconductor memory device using same.

2. Description of the Related Art

In a synchronized semiconductor memory device, such as a synchronous DRAM (SDRAM) which performs high-speed operations in synchronism with a clock supplied by the system side, internal circuit operations are carried out in synchronism with the leading edge of the clock (phase: 0°), for example, or at a timing delayed by a prescribed phase difference from the leading edge. In particular, in the case of an SDRAM, column type circuits are arranged in a pipeline configuration and pipeline gates provided between the plurality of pipeline circuits are opened by an internal control clock which is synchronized to the supplied clock, thereby causing the data in the memory cells to be transmitted and output.

However, recently, a DDR (double data rate) system has been proposed, which raises the data transfer rate by conducting internal pipeline operations in synchronism not only with the leading edge of the clock, but also with the trailing edge of the clock. In this DDR system, for example, the timing of internal operations is controlled by means of an internal control clock synchronized with the rise of the clock (phase difference 0°), and an internal control clock synchronized with the fall of the clock (phase difference 180°). Alternatively, the timing of internal operations may be controlled by means of an internal control clock which is delayed by 90° from the rise of the clock, and an internal control clock which is delayed by 90° from the fall of the clock (phase difference 270° from the rise of the clock). In a further modification, the timing of internal operations may be controlled by means of an internal control clock which is phase delayed by A° from the rise of the clock, and an internal control clock which is phase delayed by A° from the fall of the clock.

In this case, it is necessary to generate internal control clocks delayed, respectively, by a phase of A° and a phase of 180°+A° from the rise of the reference clock. A DLL circuit is known as a circuit for generating internal control clocks delayed by a prescribed phase from the rise of a reference clock. A DLL circuit comprises a phase comparing circuit which compares the phase of a first clock delayed by a prescribed phase from a reference clock with the phase of a second clock generated by a variable delay circuit to which this reference clock is supplied, and a delay control circuit which controls the amount of delay of the variable delay circuit in response to the phase difference detected by the phase comparing circuit, and it is able to generate an internal control clock delayed by a prescribed phase in the output of the variable delay circuit by controlling the delay control circuit such that there is a phase match between the rise of the first clock and the rise of the second clock.

A DLL circuit of this kind has been disclosed by the present applicant in Japanese Patent Application 8-339988 filled Dec. 19, 1996.

However, in order to generate an internal control clock which is delayed by more than 180° from the rise of the reference clock, a plurality of variable delay circuits must be provided. In a DLL circuit formed by digital circuits, the variable delay circuits comprise a plurality of gates circuits, such as inverters, connected in series, and the amount of delay is controlled by controlling the number of inverters. Therefore, the total amount of jitter produced for intermediate values of the digital delay time period increases as the number of variable delay circuits increases.

If there is a large amount of jitter in the DLL circuit, the phase of the internal control clocks generated will change significantly, and it will be difficult to generate an internal control clock which accurately maintains the prescribed phase difference with respect to the reference external clock. In order to reduce jitter, the number of gates in the variable delay circuits may be increased, but this solution poses an obstacle to integration.

Therefore, an object of the present invention is to provide a DLL circuit which is capable of generating a clock having a large phase difference with respect to a reference clock, whilst producing little jitter.

A further object of the present invention is to provide a DLL circuit which is capable of generating a clock having a phase difference of more than 180° with respect to an external reference clock, whilst producing little jitter.

A further object of the present invention is to provide a semiconductor memory device comprising the aforementioned DLL circuit.

SUMMARY OF THE INVENTION

In order to achieve the aforementioned objects, the present invention supplies a first delay control signal generated by a DLL circuit to a first variable delay circuit which generates a control clock by delaying a clock for a prescribed time period. The DLL circuit comprises: a first delay loop, comprising a second variable delay circuit and a third variable delay circuit connected in series, to which the clock is supplied; a phase comparator which is supplied with a clock which delays an integral factor of 360° of said clock from the clock, as a reference clock, and the output of the first delay loop, as a variable clock; and a delay control circuit which generates said first delay control signal in accordance with a phase comparison result signal from the phase comparator such that there is no phase difference with said two supplied clocks. The second variable delay circuit is supplied with the first delay control signal. The third variable delay circuit has a delay time of $\beta°$ in accordance with a second delay control signal generated by a $\beta°$ detecting circuit. As a result, the second variable delay circuit generates a delay time of approximately $360°-\beta°=\alpha°$. By similarly controlling the delay time of the first variable delay circuit by means of this first delay control signal, the control clock output therefrom is phase delayed by $\alpha°$ from the clock.

Furthermore, according to the present invention, in a semiconductor memory device which outputs data at a phase delay of $\alpha°$ from an external clock, a clock phase delayed by $\alpha°$ from the external clock is generated by the aforementioned DLL circuit, and this control clock is supplied to an output circuit. Accordingly, data output is controlled to a phase delay of $\alpha°$ from the external clock.

Since the DLL circuit according to the present invention uses only two variable delay circuits, the maximum jitter produced is twice the jitter associated with each variable delay circuit, so the phase of the control clock can be controlled accurately. This DLL circuit is particularly valuable in suppressing jitter when $\alpha°$ is greater than 180°.

In a DLL circuit for generating a control clock delayed by a prescribed phase $\alpha°$ from a first clock, the present invention is characterized in that it comprises: a first variable delay circuit, which inputs the first clock and generates a control clock; a first delay loop, which inputs the first clock input and comprises a second variable delay circuit and a third variable delay circuit connected in series; a first phase comparator, which compares a phase of a reference clock phase delayed by an integral factor of 360° from the first clock with a phase of a first variable clock output from the first delay loop, and generates a first phase comparison result signal corresponding to this phase difference; a first delay control circuit, which receives the first phase comparison result signal and supplies a first delay control signal causing the phases of the reference clock and the first variable clock to coincide, to the second variable delay circuit and the first variable delay circuit; and a $\beta°$ detecting circuit which generates a second delay control signal providing the third variable delay circuit with a delay time of $\beta°$ $(=360°-\alpha°)$ of the first clock.

Furthermore, in the foregoing, the present invention is also characterized in that the $\beta°$ detecting circuit comprises: a second delay loop, which inputs the first clock and comprises a plurality of variable delay circuits connected in series; a second phase comparator, which compares the phase of the reference clock with the phase of a second variable clock output from the second variable loop, and generates a second phase comparison result signal corresponding to the phase difference; and a second delay control circuit, which receives the second phase comparison result signal and supplies the second delay control signal causing the phases of the reference clock and the second variable clock to coincide, respectively to the plurality of variable delay circuits constituting the second delay loop.

DESCRIPTION OF THE PREFERRED EMBODIMENTS

Below, an embodiment of the present invention is described with reference to the drawings. However, the technical scope of the present invention is not limited to this mode of implementation.

Figure 1:
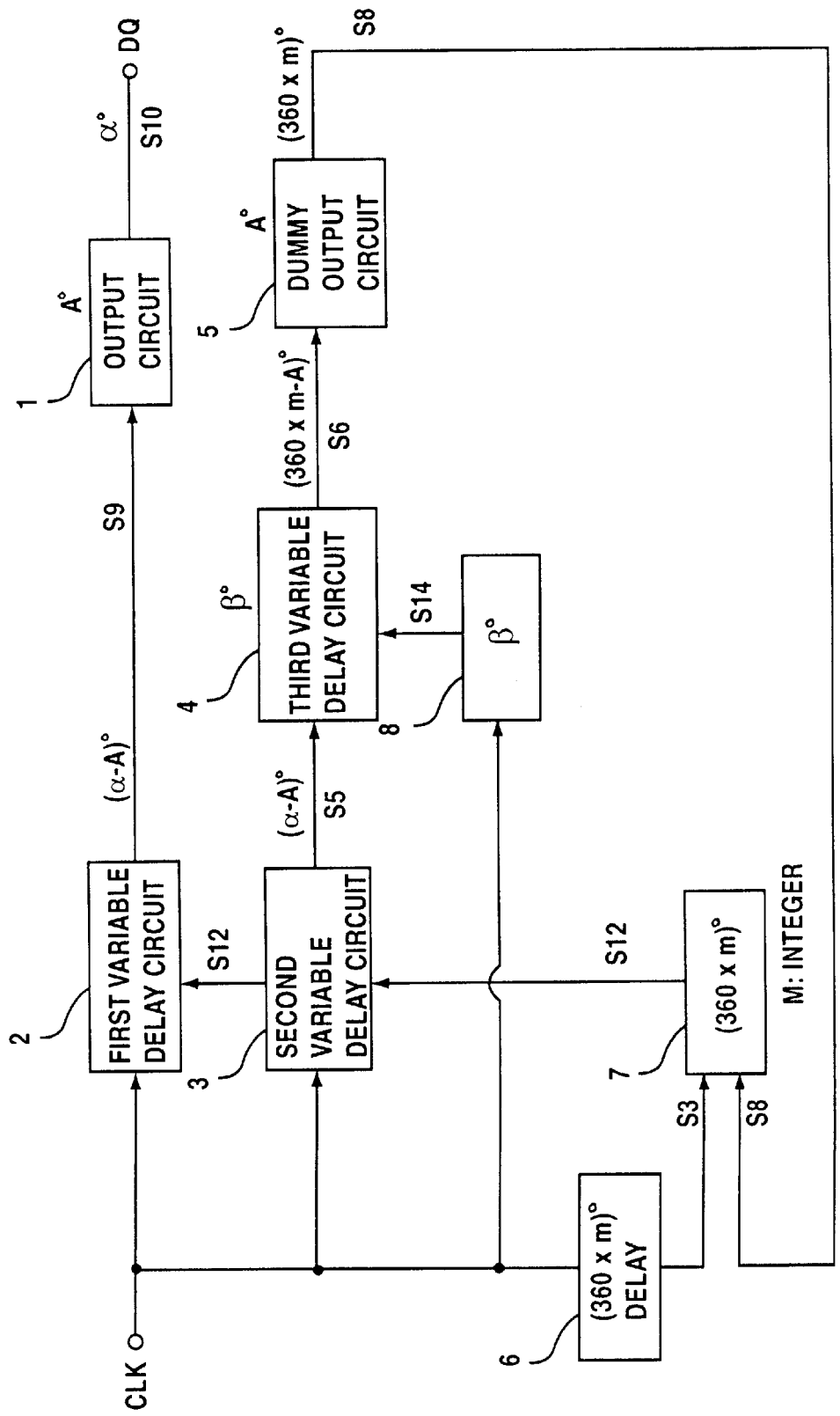
FIG. 1 is a circuit diagram illustrating the principles of the embodiment of the present invention.

FIG. 1 is a circuit diagram illustrating the principles of the embodiment of the present invention. This diagram shows, as an example, a DLL circuit which generates an internal control clock controlling the timing of output from the output circuit 1 of a memory device to a phase delay of $(\alpha-A)°$ from a reference external clock. The phase $A°$ corresponds to the delay time of the output circuit 1, and by delaying the internal control clock S9 by a phase of $(\alpha-A)°$ from the external clock CLK, the output signal S10 of the output circuit 1 is phase delayed by $\alpha°$ from the external clock.

In this diagram, the external clock CLK is supplied to a first variable delay circuit 2, which outputs an internal control clock S9 having a delay controlled by the delay control signal S12. This delay control signal S12 is generated by the DLL circuit described below. A delay circuit 6 generates a clock S3, which is delayed by 360° or an integral factor thereof from the external clock CLK, and this clock S3 is supplied to one input of a phase comparison and delay control circuit 7 as a reference clock. Furthermore, a clock S8 obtained by delaying the external reference clock CLK by means of a delay loop comprising a second variable delay circuit 3, a third variable delay circuit 4 and a dummy output circuit 5 is supplied to the other input of the phase comparison and delay control circuit 7 as a variable clock. This constitutes the DLL circuit.

In the DLL circuit, a delay control signal S12 is generated such that the phase of the variable clock S8 generated via the delay loop matches the phase of the reference clock S3. The delay time of the second variable delay circuit 3 is controlled by means of this delay control signal S12. Furthermore, the delay time of the third variable delay circuit 4 is controlled by a delay control signal S14 generated by a $\beta°$ delay control circuit 8, which detects a $\beta$ $(=360\times m-\alpha)°$ delay. Therefore, the third variable delay circuit 4 is controlled such that it has a delay time of $\beta°$. The dummy output circuit 5 has the same delay time of $A°$ as the output circuit 1.

The phase comparison and delay control circuit 7 generates a delay control signal S12 such that the phases of the two input clocks S3 and S8 coincide. Accordingly, the variable clock S8 is delayed by $(360\times m)°$ from the external clock CLK, similarly to the reference clock S3. Since the third variable delay circuit 4 has a delay time of $\beta°$ in accordance with the delay control signal S14, the second variable delay circuit 3 generates a clock S5 which is delayed by $\alpha°-A°$ $(=360\times m-\beta-A)°$ from the external clock CLK.

By controlling the delay time of the first variable delay circuit 2 by means of the delay control signal S12 which controls the delay of the similarly constructed second variable delay circuit 3, the output clock S9 of the first variable delay circuit 2 is controlled such that it is phase delayed by $(\alpha-A)°$ from the external clock CLK.

When m=1, clock S3 is delayed by 360° and clock S8 is delayed by 360°, so $\beta=360-\alpha$.

In the diagram shown in FIG. 1, the second variable delay circuit 3 and the third variable delay circuit 4 are formed by digital delay circuits. If $\alpha°>180°$, then $\beta=360-\alpha$, and therefore $\beta<180°$. Since only the second and third variable delay circuits are present in the delay loop of the DLL circuit, the total jitter can be kept to a low level, which at the maximum is twice the jitter in a single circuit. Therefore, using the DLL circuit in the diagram, it is possible to generate an accurate internal control clock S9, whilst producing little jitter, by controlling the delay time of the first variable delay circuit 2 by means of the delay control signal S12.

Figure 2:
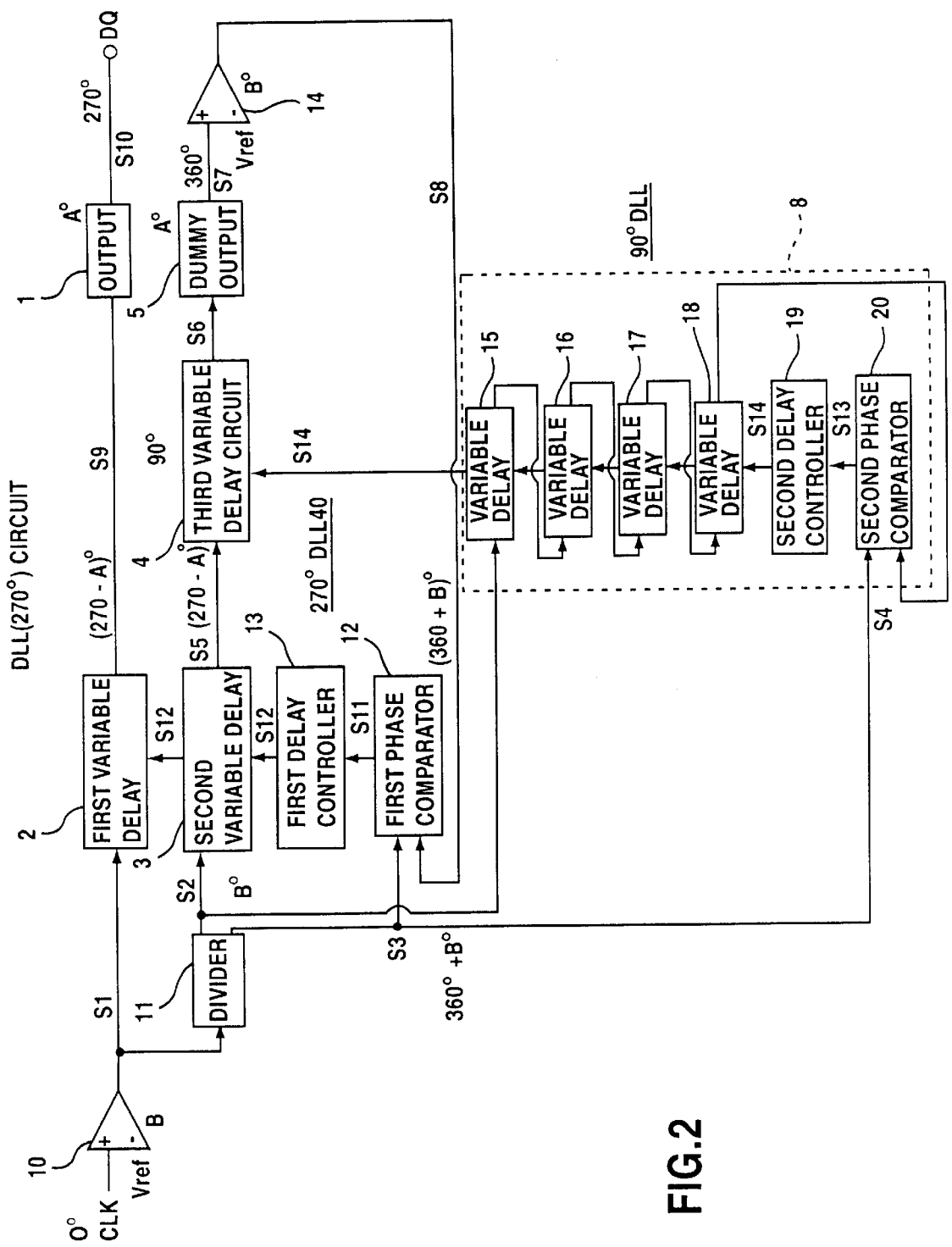
FIG. 2 shows a specific example of a DLL circuit according to the embodiment.

FIG. 2 shows a specific example of a DLL circuit according to the embodiment. This example illustrates a DLL circuit which generates an internal control clock S9 for controlling the output timing of the output circuit 1 of a memory device to a phase delay of $(270-A)°$ from an external reference clock CLK. In other words, in this example, the value of $\alpha$ in the theoretical diagram in FIG. 1 is 270° and therefore $\beta$ is 90°.

The external clock CLK is input via an input buffer 10 to generate an internal clock S1. The delay of this input buffer 10 is taken as B°. The internal clock S1 is supplied to a first variable delay circuit 2, where an internal control clock S9 is generated, which is delayed by a delay time controlled by a delay control signal S12 issued by a first DLL circuit, described below. The internal control clock S9 is phase delayed by 270° (accurately speaking, (270–A)°) from the external clock CLK. The output circuit 1 has a phase delay of A° and when it receives the internal control clock S9, it produces read-out data from memory cells (omitted from drawing) in the form of an output signal S10. The output signal S10 has a phase delay of 270° from the external clock CLK.

The delay control signal S12 which controls the delay time of the aforementioned first variable delay circuit 2 is generated by means of a first DLL circuit 40 comprising a delay loop circuit containing a second variable delay circuit 3, a first phase comparator 12, and a first delay control circuit 13. The internal clock S1 is divided into four, for example, by a frequency divider 11, and this frequency divided clock S2 is supplied to the second variable delay circuit 3. The second variable delay circuit 3 also has a delay time controlled by the delay control signal S12. The output clock S5 from the second variable delay circuit 3 is also supplied to the third variable delay circuit 4. The third variable delay circuit 4 is controlled to a phase delay of 90° and outputs a clock S6, which is supplied via the dummy output circuit 5 and a dummy input buffer circuit 14 to the first phase comparator 12 as a variable clock S8.

The frequency divider 11, on the other hand, as well as dividing the internal clock S1 into four, also generates a reference clock S3 phase delayed by 360° from the internal clock S1. For example, the frequency divider generates a clock S2 having a frequency one quarter that of the internal clock S1, and a pulse width as long as one cycle of the internal clock S1. And the inverse clock to this clock S2 forms the reference clock S3.

Figure 3:
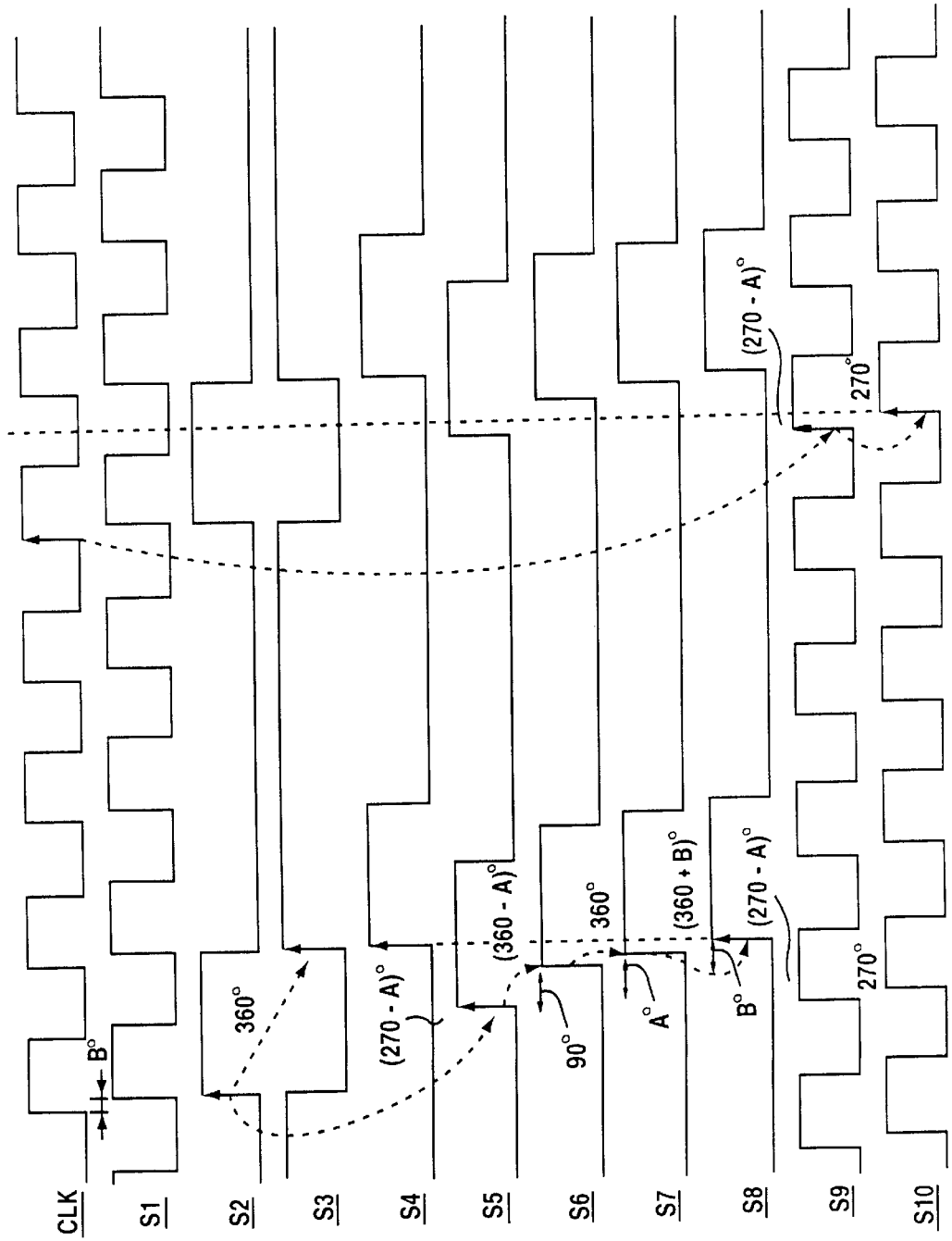
FIG. 3 is a timing chart for the circuit in FIG. 2.

FIG. 3 is a timing chart for the circuit in FIG. 2. Clock S1 has a delay of B°, which is the delay due to the input buffer 10. The frequency divider 11 generates a reference clock S2 having a cycle four times that of the internal clock S1 and a clock width of 1 cycle of the internal clock S1. Consequently, as shown in FIG. 3, the timing of the rising edge of the reverse clock S3 to the reference clock S2 is phase delayed by 360° of the external clock CLK from the timing of the rising edge of the internal clock S2. In other words, clock S3 is phase delayed by 360°+B° from the external clock CLK.

The first phase comparator 12 compares the phases of this reference clock S3 and the variable clock S8, and it generates a phase comparison result signal S11. In accordance with the first delay control circuit 13, the first delay control circuit 13 generates a delay control signal S12 such that the phases of clocks S3 and S8 coincide. The delay time of the second variable delay circuit 3 is controlled by this delay control signal S12.

The third variable delay circuit 4 is controlled by means of the delay control signal S14 such that it has phase delay of 90° of the external clock CLK. This delay control signal S14 is generated by a 90° delay control circuit 8. The 90° delay control circuit 8 forms a second DLL circuit and it comprises four variable delay circuits 15–18, to which reference clock S2 is supplied, a second phase comparator 20, and a second delay control circuit 19. The four variable delay circuits 15–18 are arranged in parallel and the output of the final variable delay circuit 18 is supplied to the second phase comparator 20 as a variable clock S4. Clock S3, which is phase delayed by 360° from clock S2, is supplied to the other input of the second phase comparator 20 as a reference clock.

The second phase comparator 20 compares the phase of the two clocks S3, S4 and generates a phase comparison result signal S13. On the basis of this phase comparison result signal S13, the second delay control circuit 19 produces a delay control signal S14 such that the phases of clocks S3 and S4 coincide. Consequently, the third variable delay circuit 4, which is similarly constructed as the variable delay circuits 15–18, also has a phase delay of 90° due to the delay control signal S14.

As described above, in the first DLL circuit 40, the delay loop is controlled such that a total delay of 360° is obtained. Thereupon, since the third variable delay circuit 4 has a phase delay of 90°, and the dummy output circuit 5 and the dummy input circuit 14, delays of A° and B°, respectively, it can be seen that the second variable delay circuit 3 is controlled by the delay control signal S12 such that it has a phase delay of 360°–(90+A+B)°=(270–A–B)°. Since clock S2 is delayed by B° from the external clock CLK, the output clock S5 from the second variable delay circuit 3 is delayed by (270–A)° from the external clock CLK.

Therefore, the internal control clock S9 which is output from the first variable delay circuit 2 controlled by the same delay control signal S12 is also regulated such that it has a phase delay of (270–A)° from the external clock CLK. As shown in FIG. 3, the output circuit 1 whose output timing is controlled by the internal control clock S9 produces an output signal S10 having a phase delay of 270° from the external clock CLK.

The only variable delay circuits contained in the first DLL circuit 40 illustrated in FIG. 2 are the second variable delay circuit 3 and the third variable delay circuit 4. Therefore, the maximum value of the jitter due to the digital delay circuits forming the variable delay circuits in the DLL circuit as a whole is twice the jitter of each variable delay circuit. Consequently, a delay control signal S12 containing little jitter can be generated. Moreover, in the DLL circuit in FIG. 2, clock S5 can be set to a desired phase by controlling the amount of delay provided by the third variable delay circuit 4.

Next, specific examples are given of the circuitry involved in the variable delay circuits, delay control circuits and phase comparators which constitute the aforementioned DLL circuit.

Figure 4:
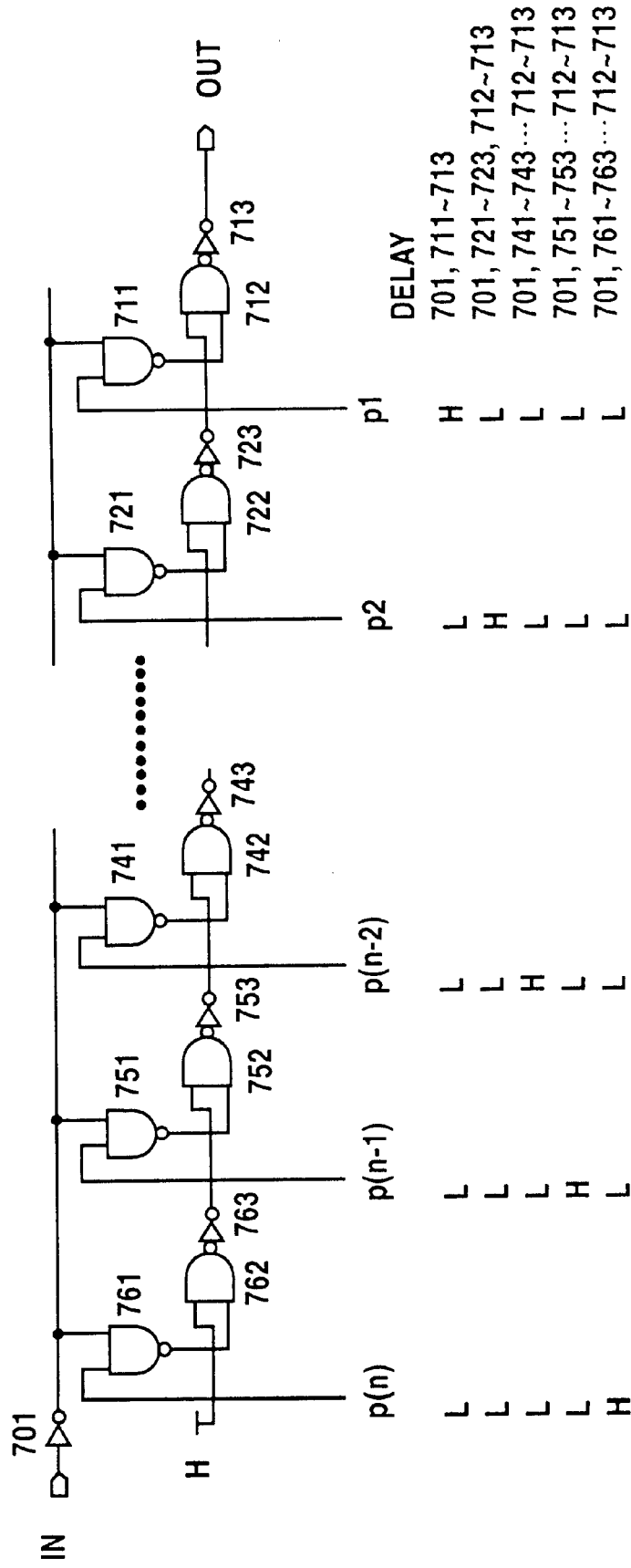
FIG. 4 is a circuit diagram showing one example of a variable delay circuit.

FIG. 4 is a circuit diagram showing one example of a variable delay circuit. The variable delay circuits 2, 3, 4 and 15–18 all have the same circuit structure. Their delay times are selected by means of delay control signals p1–p(n). These variable delay circuits receive a clock via an input terminal IN, delay it for a prescribed time period, and then output it to the output terminal OUT. In this example, there are n stages of delay circuits: the first stage comprises NAND gates 711, 712 and an inverter 713, the second stage comprises NAND gates 721, 722 and an inverter 723, and the subsequent stages are constructed similarly, up to the nth stage, which comprises NAND gates 761, 762 and inverter 763.

One of the delay control signals p1–p(n) takes a level H, and all the others take a level L. The one NAND 711, 721, . . . , 761 corresponding to the delay control signal p at level H is opened by this signal and the clock supplied to its input IN is allowed to pass. The other NANDs 711, 721, . . . , 761 corresponding to the other delay control signals at level L are all closed by these signals. As shown in the diagram, NAND 711 opens when the delay control signal p1 is at level H, and a delay path is formed from the input terminal IN to the output terminal OUT, via the inverter 701, NANDs 711, 712, and inverter 713. Therefore, a delay of four gate stages is obtained.

When the delay control signal p2 is at level H. NAND 721 opens. Since both inputs to gate 762 are at level H, the output of inverter 763 is level H and similarly, the outputs of inverters 753, 743, . . . are also level H. Therefore, NAND 722 will also be in an opened state. As a result, a delay path is formed from the input terminal IN to the output terminal OUT via inverter 701 and gates 721–723, 712, 713. Accordingly, a delay of six gate stages is obtained.

As shown in FIG. 4, each time the delay control signal p at level H moves to the left, the number of gates in the delay path increases by two. This causes jitter in the variable delay circuit. When the delay control signal p(n) is at level H, the delay path comprises 2+2n gate stages.

Figure 5:
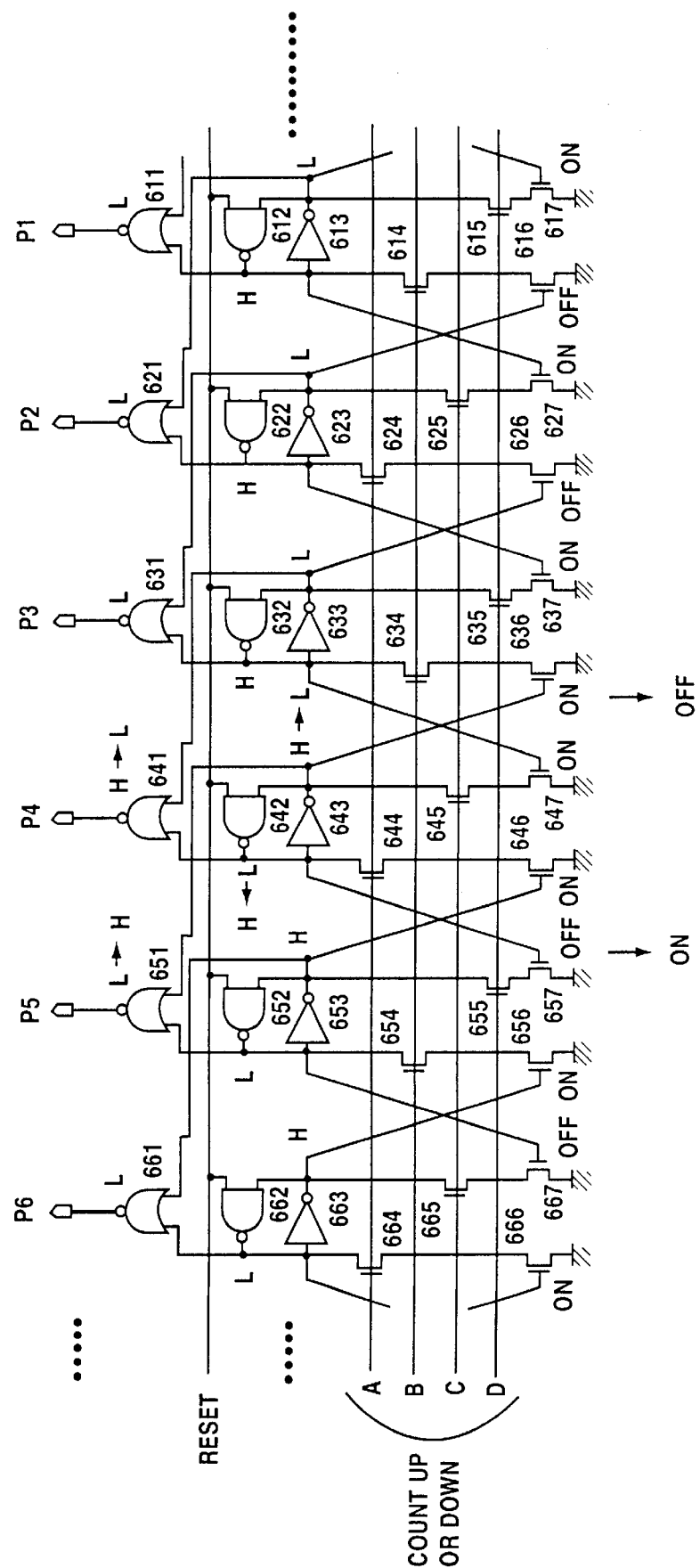
FIG. 5 illustrates a delay control circuit.

FIG. 5 illustrates a delay control circuit. In FIG. 5, a portion of a delay control circuit is shown, and for the purpose of explanation, the delay control signals p1–p6 for the variable delay circuits are illustrated. Detection signals A–D, representing phase comparison results from the phase comparator, are supplied to this delay control circuit; the delay control signal p at level H is shifted towards the right by signals A and B, and it is shifted towards the left by detection signals C and D.

Each delay control circuit stage is provided respectively with a latch circuit comprising, in the case of the first stage, for example, a NAND gate 612 and an inverter 613. It is also provided with transistors 614, 615, which reverse the state of the latch circuit 612, 613 unconditionally by means of detection signals A–D. Transistors 616, 617 are provided such that the latch circuit is not reversed by transistors 614, 615 when it is not intended to be reversed. The circuits in the $2^{nd}$ stage to $6^{th}$ stage are constructed similarly. The transistors are all N-channel type transistors.

Supposing that the fourth stage output p4 is at level H, then the other outputs will all be at level L. The states of the latch circuits at each stage are indicated by the labels H and L in FIG. 5. Namely, in the latch circuits of the first to third stages, the NAND output is level H and the inverter output is level L, whereas in the latch circuits of the fourth to sixth stages, the NAND output is level L and the inverter output is level H. Therefore, of the transistors connected to ground, transistors 617, 627, 637, 647, 646, 656, 666 each assume an "on" state. In other words, the two transistors at the boundary of the latch state, namely, transistor 647 of the fourth stage circuit and transistor 636 of the third stage circuit, assume an "on" state, and their latch stage can be reversed by means of detection signal B or C.

Therefore, if it is supposed that level H is supplied to detection signal C, then transistor 645 turns on, and the output of inverter 643 is driven unconditionally from level H to level L. As a result, the output from NAND gate 642 also switches from level L to level H and this state is latched. Since the output from NAND gate 642 assumes level H, the output p4 from NOR gate 641 assumes level L and, in its place, the output p5 from NOR gate 651 is switched to level H due to the output from inverter 643 having changed to level L. Accordingly, the delay control signal at level H shifts from p4 to p5. As described in FIG. 4, by shifting the delay control signal p at level H towards the left, the delay path of the variable delay circuit increases in length and hence the delay time is controlled such that it becomes longer.

If, on the other hand, it is supposed that detection signal B is at level H, then, in a similar operation to that described above, the output of NAND gate 632 in the third stage latch circuit is unconditionally switched to level L, and the output of inverter 633 is switched to level H. Consequently, output p3 assumes level H. Thereby, the delay path of the variable delay circuit is shortened and hence the delay time is controlled such that it becomes shorter.

When output p5 or p3 assumes level H, the output at level H is shifted to the right or the left by means of detection signal A or D. In other words, detection signals A and B shift the level H output to the right and detection signal C and D shift the level H output to the left. Furthermore, detection signals A and D shift the output when an odd-numbered output p1, p3, p5 is at level H, and detection signals B and C shift the output when an even-numbered output p2, p4, p6 is at level H.

Figure 6:
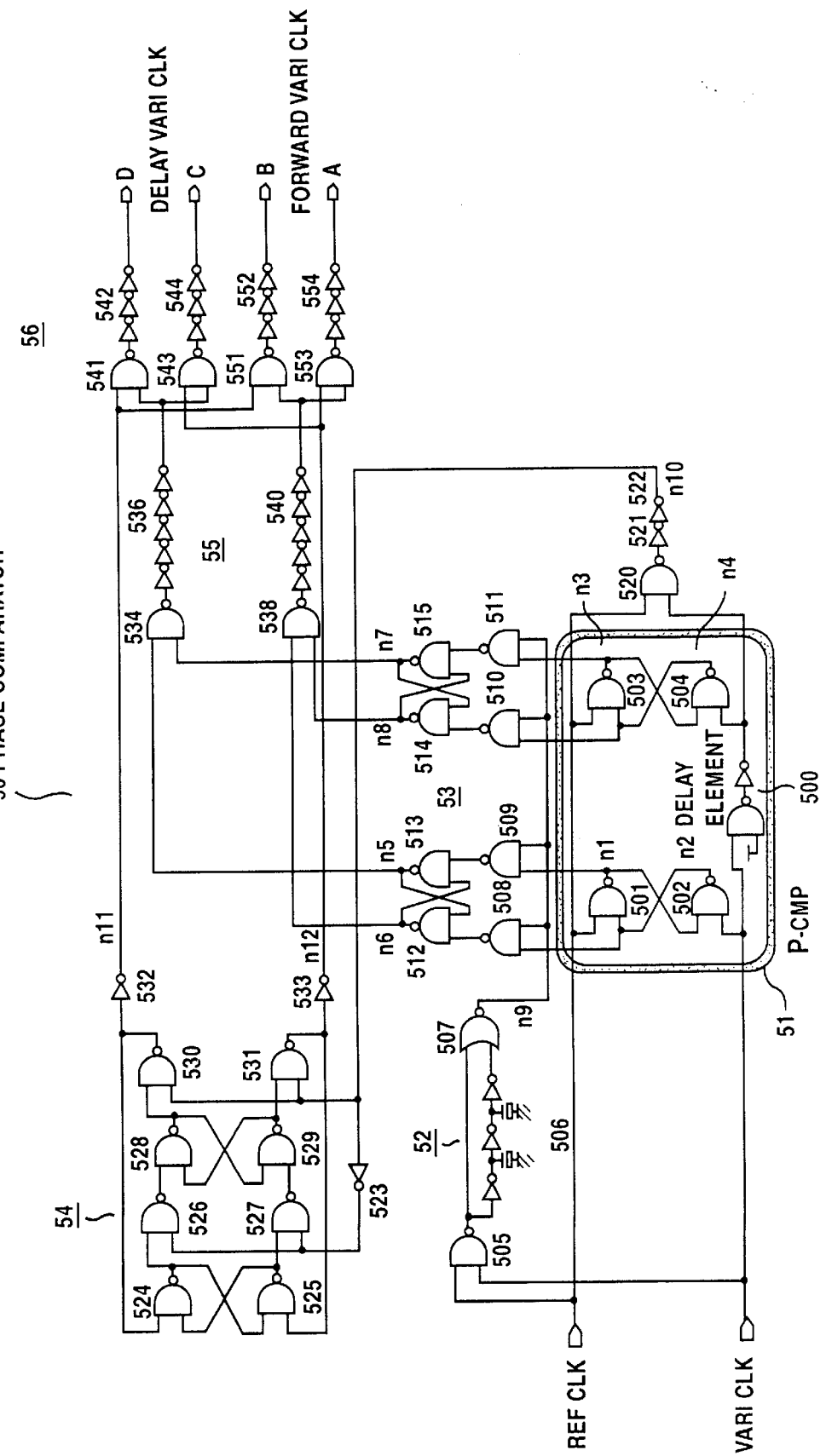
FIG. 6 is a detailed circuit diagram of a phase comparator.

FIG. 6 is a detailed circuit diagram of a phase comparator. This phase comparator comprises a phase detecting section 51 which detects the relationship between the phase of a variable clock VariCLK and a reference clock RefCLK. This phase comparing section 51 comprises two latch circuits constituted by NAND gates 501, 502 and 503, 504, and it detects when the phase of the variable clock VariCLK is (1) advanced by a prescribed time period or more; (2) in a phase difference relationship within a prescribed time period; or (3) delayed by a prescribed time period or more; with respect to the reference clock RefCLK. The three states described above are detected by a combination of detection outputs n1–n4.

The sampling pulse generating section 52 comprises a NAND gate 505, delay circuit 506 and NOR gate 507, and when the two clocks, RefCLK and VariCLK are both at level H, a sampling signal is output to node n9. In accordance with this sampling signal n9, a sampling latch circuit section 53 samples detection outputs n1–n4 by means of sampling gates 508–511, and it latches them by means of a latch circuit comprising NANDs 512, 513 and 514, 515. Therefore, the sampled detection outputs n1–n are latched respectively to nodes n5–n8.

A one-into-two frequency divider 54 having a JK flip-flop structure receives a detection pulse n10 when NAND gate 520 detects that both clocks VariCLK and RefCLK are at level H, and it divides the frequency of this detection pulse n10 in half, to generate reverse phase pulse signals n11 and n12. The decoder section 55 decodes the sampled and latched signals from nodes n5–n8: if the variable clock VariCLK is ahead of the reference clock RefCLK, the output of inverter 536 is set to level H; if the two clocks match in phase, the output of inverters 536 and 540 are set to level; and if the variable clock VariCLK is behind the reference clock RefCLK, then the output of inverter 540 is set to level H. The output circuit section 56 outputs a detection signal A–D in response to the reverse phase pulse signals n11 and n12, according to the output of the decoder section 55.

Figure 7:
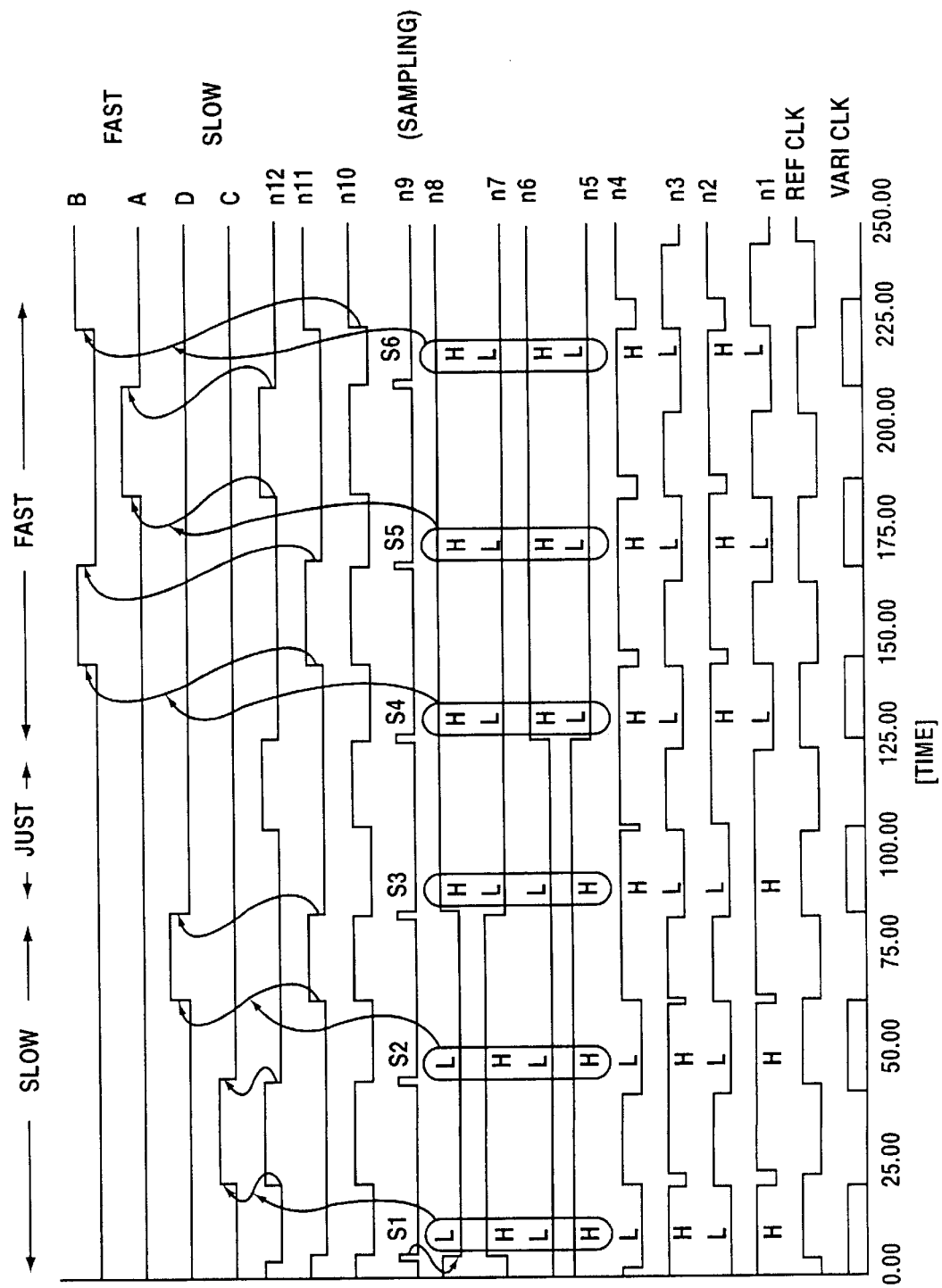
FIG. 7 is a timing chart showing the operation of FIG. 6.

FIG. 7 is a timing chart showing the operation of FIG. 6. This diagram shows in sequence a state where the variable clock VariCLK is ahead of the reference clock refCLK, a state where the two clocks are matched in phase, and a state where the variable clock VariCLK is behind the reference clock RefCLK. In other words, when the sampling pulse is S1 or S2, the variable clock VariCLK is ahead, so when this is detected, detection signal C is output at level H in response to pulse n12, and detection signal D is output at level H in response to pulse n11. When the sampling pulse is S3, the phases are matched and all the detection signals A–D are set to level L. Furthermore, in the case of sampling pulses S4, S5, S6, the variable clock VariCLK is behind, so when this is detected, detection signal B or detection signal A are output at level H, in response to pulse n11 or pulse n12, respectively. The operation of the foregoing is now described in sequence.

Sampling Pulse S1

In this time period, since the variable clock VariCLK is ahead, then from a state where both clocks VariCLK and RefCLK are at level L, the variable clock VariCLK first switches to level H, and node n2 is latched at level L and node n1 is latched at level H. The NAND and inverter 500 form a delay element which delays the variable clock VariCLK by a prescribed time period, and then at NANDs 503 and 504, similarly, node n3 is latched at level H, and node n4 is latched at level H. Thereupon, at the timing at which both clocks VariCLK and RefCLK assume level H, the sample pulse generating section 52 generates a sampling pulse n9 having a width equal to the delay time of delay circuit 506, the latched states in phase comparator 51 are sampled, and these states are latched by the latch section 53. In other words, the states of nodes n1–n4 are transmitted to nodes n5–n8.

Thereupon, a pulse n10 is generated at the timing at which both clocks VariCLK and RefCLK take level H. In the frequency dividing circuit 54, the latch circuit of NANDs 524 and 525, and the latch circuit of NANDs 528, 529 are coupled to gates 526, 527 and gates 530, 531, and these gates are opened by the reversed or non-reversed pulse from n10. Therefore, the pulse n10 is frequency divided by one half into the signals at nodes n11 and n12.

In the decoder section 55, the output of inverter 536 is set to level H and the output of inverter 540 is set to level L. Therefore, in response to pulse n12, the level H output from inverter 536 sets detection signal C to level H, via NAND 543 and inverters 544. Since detection signal C is set to H, the level H output in the shift register is shifted towards the left, and the delay path of the variable delay circuit becomes longer. As a result, the variable clock VariCLK is controlled such that it is slowed down.

Sampling Pulse S2

Similarly to the foregoing, the phase comparator 51 detects that the variable clock VariCLK is ahead, and detection signal D is set to level H in response to pulse n11. Therefore, the level H output forming the delay control signal of the delay control circuit is shifted similarly towards the left, and the delay path of the variable delay circuit becomes even longer.

Sampling Pulse S3

At the timing that sampling pulse S3 is output, the phases of both clocks VariCLK and RefCLK are substantially matching. If there is a phase difference within the delay time of the delay element 500, and the variable clock VariCLK is a little ahead, the various pulses will be:
n1=H, n2=L, n3=L, n4=H
n5=H, n6=L, n7=L, n8=H
This state is illustrated in FIG. 7. If there is a phase difference with the delay time of the delay element 500, and the variable clock VariCLK is a little behind, the pulses will be:
n1=L, n2=H, n3=H, n4=L
n5=L, n6=H, n7=H, n8=L In either case, the pulses are decoded by the decoder section 55 and the output of both inverters 536 and 540 is set to level L, and the detection outputs A–D are all set to level L. As a result, there is no change in the state of the delay control circuit, and hence no change in the delay time of the variable delay circuit.

Sampling Pulses S4, S5, S6

In this case, the variable clock VariCLK is behind. Therefore, the latched states in the phase comparator 51 will be
n1=L, n2=H, n3=L, n4=H
and consequently, the nodes in the sampled latch section 53 will be
n5=L, n6=H, n7=L, n8=H.
These states are decoded by the decoder section 55 and the inverter 536 is set to level L output and inverter 540 is set to level H output. Hence, detection signals B and A are set to level H in response to pulses n11 and n12, respectively. Accordingly, the delay control signal p of the delay control circuit is shifted towards the right, thus shortening the delay path of the variable delay circuit and hence shortening the delay time. Thereby, the variable clock VariCLK is controlled such that it advances.

Figure 8:
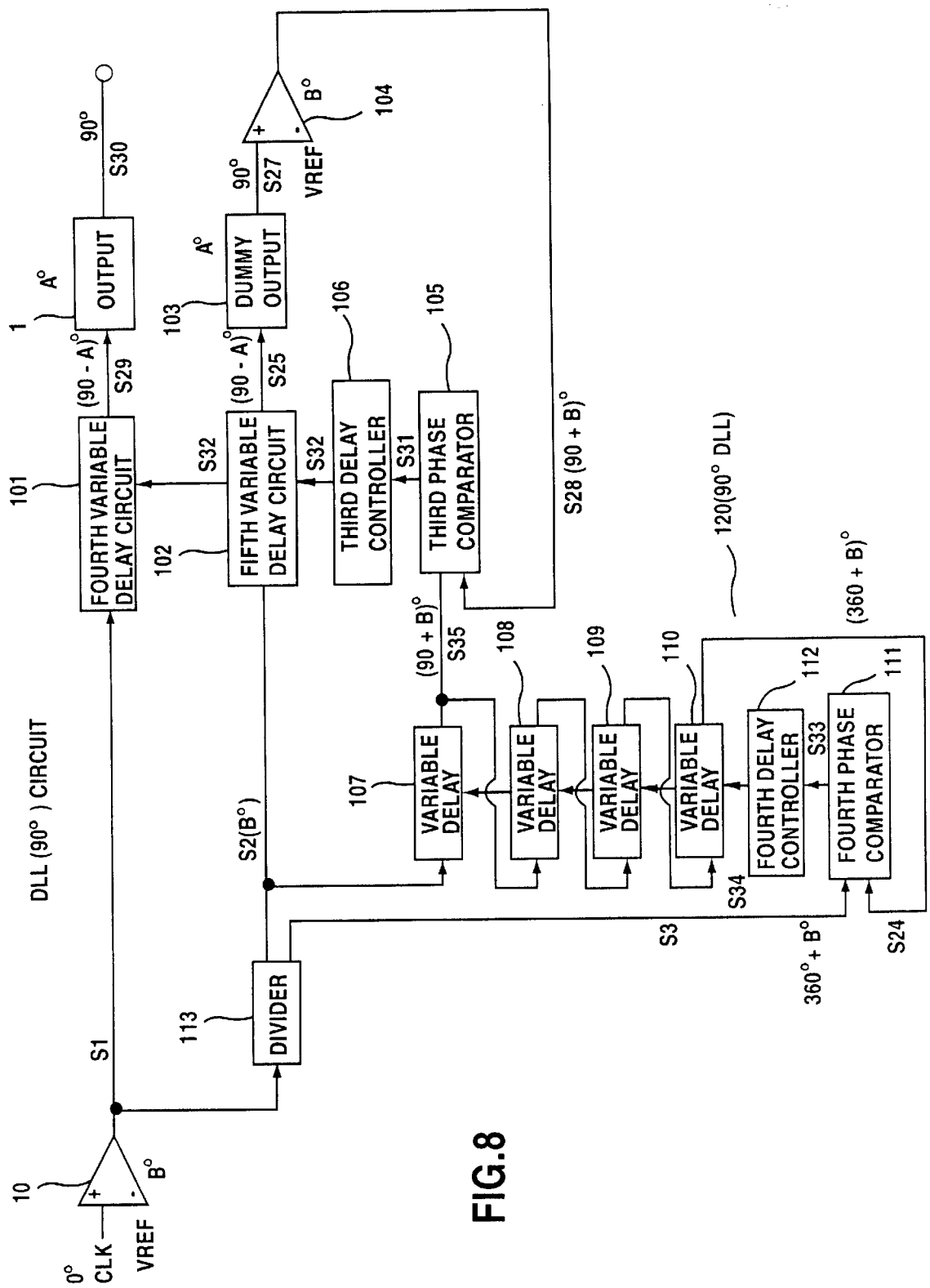
FIG. 8 shows a further example of a DLL circuit for the purpose of comparing with DLL circuit in FIG. 2.

FIG. 8 shows a further example of a DLL circuit for the purpose of comparing with DLL circuit in FIG. 2. This example shows a DLL circuit which generates an internal control clock S29 phase delayed by 90° from an external clock CLK. The external clock CLK is input by an input buffer 10 to produce an internal clock S1. Therefore, the internal clock S1 is delayed by the delay B° of the input buffer circuit 10. This internal clock S1 is then delayed by a fourth variable circuit 101 to generate an internal control clock S29. In accurate terms, the internal control clock S29 has a timing delayed by (90−A)° from the external clock CLK. A° corresponds to the delay time of the output circuit 1.

This DLL circuit comprises a delay loop, containing a fifth variable delay circuit 102, a dummy output circuit 103, and a dummy input buffer 104, and a third phase comparator 105 and a third delay control circuit 106. The variable delay circuits, delay control circuits and delay control circuits are the same circuits as illustrated in FIGS. 4–7. The reference clock S35 input to the phase comparator 105 is a clock delayed by 90° from clock S2 obtained by dividing the internal clock S1 at a frequency divider 113 to generate a clock S2. The variable clock S28 is the output of the delay loop.

The 90° DLL circuit 120 comprises four variable delay circuits 107–110, a fourth phase comparator 111, and a fourth delay control circuit 112. This is configured similarly to the 90° DLL circuit 8 shown in FIG. 2. A clock S3 which is divided by the frequency divider 113 and phase delayed by 360° is supplied to the fourth phase comparator 111 as a reference clock, and a clock S24 obtained by delaying the clock S2 by means of the four variable delay circuits 107–110 is supplied to the fourth phase comparator 111 as a variable clock. Therefore, if the fourth delay control circuit 112 generates a delay control signal S34 such that both clocks S3, S24 match in phase, one of the variable delay circuits 107–110 will have a respective phase delay of 90°. Clock S35, which is delayed by 90° from clock S2 (90°+B° from the external clock), is supplied as a reference clock to the third phase comparator 105.

The third phase comparator 105 compares clock S35, which is delayed by (90+B)° from the external clock CLK, with variable clock S28 and generates a phase comparison result signal S31. The third delay control circuit 106 generates a delay control signal S32 on the basis of the phase comparison result signal S31 such that the two clocks match in phase, and the delay in the fifth and fourth variable delay circuits is controlled by means of S32. Accordingly, output S25 from the fifth variable delay circuit 102 is phase delayed by (90−A)° from the external clock CLK. Similarly, the internal control clock S29 is also phase delayed by (90–A)° from the external clock CLK and the output S30 from the output circuit 1 is phase delayed by 90° from the external clock CLK.

By selecting the outputs of the four variable delay circuits 107–110 as appropriate reference clock S35, the DLL circuit illustrated in FIG. 8 is able to set the delay of the internal control clock S29 to 90°, 180°, 270° or 360°. Furthermore, by supplying clock S2 as a reference clock to the third phase comparator, without passing via the variable delay circuits 107–110, it is possible to generate an internal control clock S29 with a phase difference of 0°.

As described above, by using the output of the third variable delay circuit 109 as a reference clock for the third phase comparator 105, it is possible to generate an internal control clock S29 delayed by (270–A)° from the external clock CLK. However, in this case, in addition to the fifth variable delay circuit 102, the DLL circuit also contains the three variable delay circuits 107, 108 and 109. These respective variable delay circuits each produce jitter and the total jitter of the DLL circuit will be four times the jitter of a single variable delay circuit, at a maximum. In the example illustrated in FIG. 4, the resolution of the delay time in the variable delay circuits is equal to two gate stages. Therefore, when intermediate delay characteristics are required, jitter corresponding to the delay time for two gate stages is produced. Consequently, as the number of variable delay circuits in the DLL circuit increases, this jitter multiplies and the overall jitter is large. Since this jitter produces timing errors in the internal control clock S29, desirably, it should be made as small as possible.

In the DLL circuit illustrated in FIG. 2, the delay time is 270°, which is over 180°, but since the DLL (270°) circuit only contains two variable delay circuits 3 and 4, the level of jitter is similar to that in the DLL (90°) circuit in FIG. 8.

Figure 9:
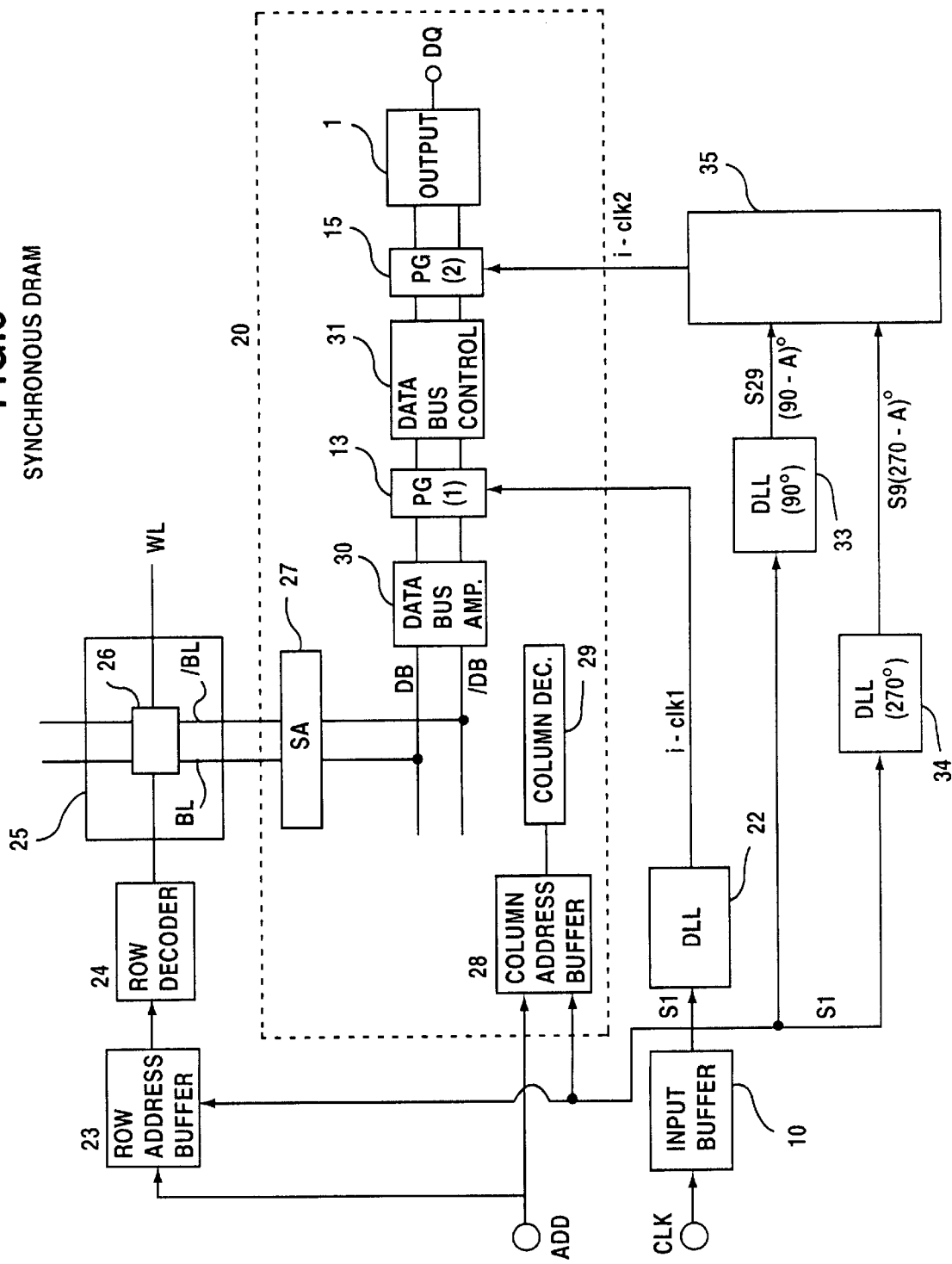
FIG. 9 is a diagram showing a specific example wherein the DLL circuits shown in FIG. 2 and FIG. 8 are applied to an SDRAM.

FIG. 9 is a diagram showing a specific example wherein the DLL circuits shown in FIG. 2 and FIG. 8 are applied to an SDRAM. In this example, the column circuit 20 has a pipeline configuration. A row address and a column address are supplied from a common address terminal Add, and the initial row address supplied in synchronism with the external clock CLK is input to a row address buffer 23, where it is amplified and then supplied to a row decoder 24. A word line WL selected by the row decoder 24 is driven and a memory cell 26 is selected. The data in memory cell 26 is output to one of the bit lines BL, /BL, and it is amplified along with the other reference voltage at a sensor amplifier 27. The description thus far has involved the operation of the row address side of the circuit.

Thereupon, the column address is supplied to the address terminal Add in synchronism with the external clock CLK and it is amplified by a column address buffer 28. This address signal is decoded by a column decoder 29 and the sensor amplifier selected from amongst the sensor amplifiers 27 is connected to the pair of data bus lines DB and /DB. The data on data bus lines DB and /DB is amplified further by a data bus amplifier 30. In the column circuit 20, the circuitry described thus far corresponds to a first stage pipeline circuit, for instance.

The external clock CLK is first amplified by the clock input buffer 10 and then supplied to the DLL (Delayed Lock Loop) circuit 22, which forms an internal clock generating circuit. The DLL circuit 22 generates an internal clock i-clk having a phase which is ahead of the external clock by a time period corresponding to the delay time A° of the output circuit 1. This DLL circuit is composed as shown in FIG. 8, for example. The internal clock i-clk is supplied to a pipeline gate 13, and the pipeline gate 13 opens in synchronism with the internal clock i-clk.

Moreover, the data bus control circuit 31 corresponds to a second stage pipeline circuit and it conducts prescribed control operations, such as selecting the data bus, or the like. The pipeline gate 15 also opens in synchronism with the control clock i-clk 2, whereby the output signal from the data bus control circuit 31 is supplied to the output circuit 1. The read-out data from the output circuit 1 is output to the data output terminal DQ.

The internal clock S1 is supplied to a DLL circuit 34 as illustrated in FIG. 2 and a DLL circuit 33 as illustrated in FIG. 8. These DLL circuits respectively generate a control clock S9 delayed by (270–A)°, and a control clock S29 delayed by (90–A)°, from the external clock CLK.

Figure 10:
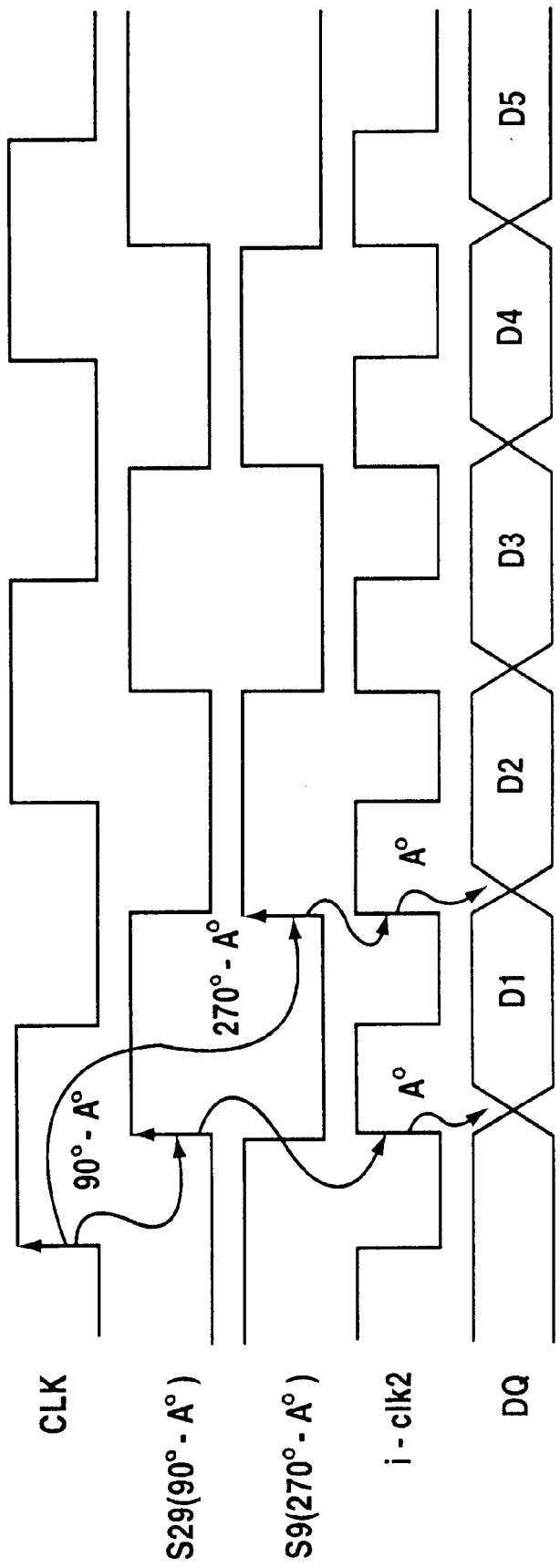
FIG. 10 is a timing chart for the SDRAM in FIG. 9.

FIG. 10 is a timing chart for the SDRAM in FIG. 9. As shown in this diagram, control clocks S9 and S29 are generated with respect to the external clock CLK. A clock synthesizing circuit 35 generates a control clock i-clk 2 having twice the frequency of the leading edges of the clocks S9 and S29. The pipeline gate 15 is opened by this control clock i-clk 2 and read-out data is output from the output circuit 1 to a DQ terminal at the phase 90° and 270° from the external clock CLK. As illustrated in FIG. 10, by generating control clocks S9 and S29, the output rate from output circuit 1 can be set to twice the rate of the external clock CLK.

As described above, according to the present invention, in a DLL circuit for generating a clock having a phase delay of over 180° with respect to a reference clock, it is possible to generate a desired clock by means of the second variable delay circuit and third variable delay circuit, without using a plurality of variable delay circuits generating a delay over 180°. Therefore, the total amount of jitter in the digital variable delay circuits in the DLL circuit can be reduced, and hence a control clock having a more accurate phase delay can be generated.

What is claimed is:

1. A DLL circuit which generates a control clock delayed by a prescribed phase α° from a first clock, said DLL circuit comprising:

a first variable delay circuit, which inputs said first clock and generates said control clock;

a first delay loop, which inputs said first clock and comprises a second variable delay circuit and a third variable delay circuit connected in series;

a first phase comparator, which compares a phase of a reference clock having a phase delay equal to an integral factor of 360° from said first clock with a phase of a first variable clock output from said first delay loop, and generates a first phase comparison result signal corresponding to this phase difference;

a first delay control circuit, which receives said first phase comparison result signal and supplies a first delay control signal causing the phases of said reference clock and said first variable clock to coincide, to said second variable delay circuit and said first variable delay circuit; and a β° detecting circuit which generates a second delay control signal providing said third variable delay circuit with a delay time of β° (=360°–α°) of said first clock.

2. The DLL circuit, according to claim 1, wherein said β° detecting circuit comprises a second delay loop, which inputs said first clock and comprises a plurality of variable delay circuits connected in series;

a second phase comparator, which compares the phase of said reference clock with the phase of a second variable clock output from said second variable loop, and generates a second phase comparison result signal corresponding to the phase difference; and a second delay control circuit, which receives said second phase comparison result signal and supplies said second delay control signal causing the phases of said reference clock and said second variable clock to coincide, respectively to the plurality of variable delay circuits constituting said second delay loop.

3. The DLL circuit, according to claims 1 or 2, wherein said β° is over 180°.

4. The DLL circuit, according to claim 1, wherein said variable delay circuit comprises a plurality of logic gates connected in series, and the number of stages of said logic gates can be set variably by means of said delay control signal.

5. The DLL circuit, according to claim 1, further comprising an input buffer which receives an external clock and outputs said first clock; an output circuit which receives said control clock produced by said first variable delay circuit and generates a prescribed output at the timing of said control clock; and a dummy input buffer having a similar delay time to said input buffer and a dummy output circuit having a similar delay time to said output circuit both of which are provided in said first delay loop.

6. A semiconductor memory device which generates data output delayed by a prescribed phase α° from an external clock, a semiconductor memory device, comprising:

an output circuit, which receives a control clock and generates said data output;

an input buffer, which receives said external clock and output a first clock;

a first variable delay circuit which inputs said first clock and generates said control clock, in accordance with a first delay control signal; and a DLL circuit which generates said first delay control signal;

wherein said DLL circuit comprises:

a first delay loop, which inputs said first clock and comprises a second variable delay circuit and a third variable delay circuit connected in series;

a first phase comparator, which compares a phase of a reference clock having a phase delay equal to an integral factor of 360° from said first clock with a phase of a first variable clock output from said first delay loop, and generates a first phase comparison result signal corresponding to this phase difference;

a first delay control circuit, which receives said first phase comparison result signal and supplies said first delay control signal causing the phases of said reference clock and said first variable clock to coincide, to said second variable delay circuit and said first variable delay circuit; and a β° detecting circuit which generates a second delay control signal providing said third variable delay circuit with a delay time of β° (=360°−α°) from said first clock.

7. The semiconductor memory device, according to claim 6, wherein said β° detecting circuit comprises:

a second delay loop, which inputs said first clock and comprises a plurality of variable delay circuits connected in series;

a second phase comparator, which compares the phase of said reference clock with the phase of a second variable clock output from said second variable loop, and generates a second phase comparison result signal corresponding to the phase difference; and a second delay control circuit, which receives said second phase comparison result signal and supplies said second delay control signal causing the phases of said reference clock and said second variable clock to coincide, respectively to the plurality of variable delay circuits constituting said second delay loop.

8. The semiconductor memory device, according to claims 6 or 7, wherein said β° is over 180°.

9. The semiconductor memory device, according to claims 6 or 7, wherein in said first delay loop, a dummy input buffer having a similar delay time to said input buffer and a dummy output circuit having a similar delay time to said output circuit.

* * * * *